United States Patent [19]

Dingwall et al.

[11] Patent Number: 5,332,997
[45] Date of Patent: Jul. 26, 1994

[54] SWITCHED CAPACITOR D/A CONVERTER

[75] Inventors: Andrew G. F. Dingwall, Princeton; Sherman Weisbrod, Skillman, both of N.J.

[73] Assignee: RCA Thomson Licensing Corporation, Princeton, N.J.

[21] Appl. No.: 124,679

[22] Filed: Sep. 23, 1993

Related U.S. Application Data

[63] Continuation of Ser. No. 971,104, Nov. 4, 1992, abandoned.

[51] Int. Cl.$^5$ .............................................. H03M 1/66
[52] U.S. Cl. ........................................ 341/150; 341/136
[58] Field of Search .......................... 341/136, 145, 150

[56] References Cited

U.S. PATENT DOCUMENTS

| | | | |
|---|---|---|---|
| 4,412,208 | 10/1983 | Akazawa et al. | 341/145 |
| 4,517,551 | 5/1985 | Campbell, Jr. et al. | 341/150 |
| 4,584,568 | 4/1986 | Zomorrodi | 340/347 |
| 4,611,195 | 9/1986 | Shosaku | 340/347 |
| 4,661,802 | 4/1987 | Yukawa | 340/347 |
| 4,667,179 | 5/1987 | Law et al. | 340/347 |
| 4,872,011 | 10/1989 | Pelgrom et al. | 341/150 |
| 4,873,525 | 10/1989 | Iida | 341/145 |
| 4,888,587 | 12/1989 | Kuraishi | 341/122 |
| 4,937,578 | 6/1990 | Shioda | 341/150 |
| 4,968,989 | 11/1990 | Olmstead et al. | 341/150 |
| 5,008,674 | 4/1991 | DaFranca et al. | 341/150 |
| 5,057,838 | 10/1991 | Tsuji et al. | 341/133 |

*Primary Examiner*—Marc S. Hoff
*Attorney, Agent, or Firm*—Joseph S. Tripoli; Eric P. Herrmann; Ronald H. Kurdyla

[57] ABSTRACT

A set of N digital data bits serially supplied to an input node are converted to an analog voltage by means of N binary weighted capacitors and N switching transistors, one capacitor being associated with one switching transistor for each one of the N digital data bits. Each capacitor is connected between an output node and via the conduction path of its associated switching transistor to a first power terminal. Two transistors are used to selectively sample the N bits of serial data and to couple and store the sampled data on the gates of the switching transistors which are precharged so that the two transistors coupling the serial data only need to conduct in the common source mode. The serial data applied to the gates of the switching transistor is transferred to the N capacitors when a charging voltage is applied to the output node. Following the data transfer onto the binary weighted capacitors, the switching transistors are precharged and, concurrently the N capacitors are connected in parallel to produce an analog voltage corresponding to the serial data.

20 Claims, 9 Drawing Sheets

SWITCHED CAPACITOR D/A CONVERTER

This is a continuation of application Ser. No. 971,104, filed Nov. 4, 1992, now abandoned.

BACKGROUND OF THE INVENTION

This invention relates to digital-to-analog (D/A) converters and, in particular, to a D/A converter of the charge redistribution type.

D/A converters of the charge redistribution type normally include an array of binary weighted capacitors which are selectively charged (or discharged) to represent the value of a digital signal. After selected capacitors of the array are charged, the charge stored on the selected capacitors is then redistributed among all the capacitors of the array to produce an analog voltage representative of the digital signal.

This is best explained with reference to the prior art circuit of FIG. 1 in which 6-bit digital data signals (D1 through D6) are converted into an analog voltage at an output line OL by means of 6 capacitors (C1 through C6) and 6 switching circuits (S1 through S6). The six capacitors C1 through C6 are binary weighted with the smallest capacitor (i.e., C1) having a value equal to one unit of capacitance (C) and the largest capacitor (i.e., C6) having a value equal to 32 units of capacitance (32C). D6, the most significant bit (MSB) of information, is applied to and stored on the largest capacitor (i.e., C6) and D1, the least significant bit (LSB) of information, is applied to and stored on the smallest capacitor (i.e., C1).

As shown in FIG. 1, one side (X) of each capacitor (C1 through C6) is connected to output line, OL. The output line (OL) is selectively coupled either to Vcc volts via a first metal oxide semiconductor (MOS) transistor switch PL or to ground potential via a second MOS transistor switch NL. The other side (Y) of each capacitor (Ci) is selectively connected either via an MOS transistor switch (PSi) to Vcc volts or via an MOS transistor switch (NSi) to ground potential. Thus two switching transistors are used at each Y side of each capacitor to set each capacitor to a desired condition.

After the digital information is applied to and stored on selected capacitors, all the capacitors are connected in parallel causing the charge stored on selected capacitors to be redistributed among all the capacitors to produce an analog voltage representative of the applied digital input signal.

The sequence of steps and time periods required to perform digital signal to voltage conversion with the circuit of FIG. 1 is as follows.

1. During a first initialization time period, all the capacitors (Ci) are discharged to set them to the same initial condition. This is accomplished, for example, by turning PL OFF and NL ON; and turning all the PSi transistors OFF and all the NSi transistors ON.

2. During a second, subsequent, data loading time period, each digital data signal (Di) is applied via complementary transistors PSi or NSi to the Y side of a Ci capacitor and a charge corresponding to each data signal is stored on a Ci capacitor. This is accomplished, for example, by: (a) turning PL ON and NL OFF whereby OL is held at Vcc volts; and (b) each capacitor (Ci) is either charged if the input serial bit, Di, is "high" or Vcc volts, since Di-high turns ON its NSi transistor and turns OFF its PSi transistor; or remains uncharged if Di is a "low" or "zero" volts, since Bi-low turns ON its transistor PSi, and turns OFF its transistor NSi.

3. During a third, subsequent, recombination or conversion time period, all the Ci capacitors are connected in parallel to produce an analog voltage which is representative of the value of the digital signal. This is accomplished, for example, by: (a) turning PL and NL OFF; and (b) turning all the NSi transistors ON and all the PSi transistors OFF.

4. During a fourth, subsequent, time period, the analog voltage produced across the capacitors is read out via a transfer gate transistor (TR) coupling the output line OL to an amplifier AMP1.

The digital-to-analog converter (DAC) circuit of FIG. 1 is well suited for many applications. However, a number of problems exist with the DAC circuit of FIG. 1 where it is desired and/or necessary to form a high density DAC system. In such a system, many capacitors have to be charged quickly during a data load cycle. This is problematic because having to charge the capacitors (Ci) directly and sequentially in a short period of time requires large transistors to handle the large instantaneous currents needed to charge the largest capacitors. On the other hand where small low conductivity transistors are employed, the charging time becomes long and may exceed the time constraints of the system.

Furthermore, a significant problem exists with the circuit of FIG. 1 where it is desired to build a high density DAC system employing transistors such as those made of amorphous silicon. These transistors are easy and inexpensive to fabricate and it is therefore desirable to use this type of transistor. This is particularly so where a display panel is formed making use of these types of transistors whereby the display and the control circuitry can be formed using similar technology. Unfortunately, these transistors have low mobility, low gain and high threshold voltages. In addition, these transistors are presently available only in one conductivity type (i.e., N-channel conductivity type). As a result of their low gain and low conductivity and their relatively high threshold voltages (e.g., VT ranges from 3 to 5 volts), these transistors when operated in the source-follower mode tend to respond very slowly. The slow source-follower mode response presents a problem which is very pronounced in the amorphous silicon technology. However, in general, this problem exists whenever transistors of only one conductivity are available; i.e., the transistors provide good switching action when operated in the common source mode and poor (slow) action when operated in the source follower mode.

Still further it is desirable and or necessary to reduce the time to perform the digital-to-analog conversion, particularly in high density systems where a multiplicity of conversions must be performed in a very limited time.

Still further, it is desirable to reduce the number of components such as the use of two transistors per Y side of each capacitor. Reducing the number of components increases the yield and reliability of the circuit and enables the circuit to be laid out such that the circuit can be built more easily on pitch with the column and row conductors of a display panel intended for use with the DAC system.

The problems discussed above and others, discussed below, are resolved in circuits and systems embodying the invention.

SUMMARY OF THE INVENTION

In circuits embodying the invention a set of N digital data bits supplied to an input node are converted to an analog voltage by means of N weighted capacitors and N switching transistors, one capacitor being associated with one switching transistor for each one of the N digital data bits. Each capacitor has first and second plates, with the first plate of each capacitor being connected to an output line. Each switching transistor has a conduction path and a gate electrode with which there is associated a gate capacitance which is relatively small compared to the value of the largest binary weighted capacitors. The conduction path of each switching transistor is connected between the other side of its associated capacitor and a reference potential. The N digital data bits are coupled to the gates of the N switching transistors via N selectively enabled data transfer paths, one data transfer path per switching transistor, each data transfer path being connected between the input node and the gate electrode of its corresponding switching transistor.

During a data load period, voltage levels corresponding to the N data bits are selectively sampled via the N data transfer paths and stored on the gates of the switching transistors. Thus, during a data load period data signals are sampled and stored on the gate capacitance of the switching transistors. Due to the small gate capacitance of the switching transistors the loading of the data onto their gates is accomplished very quickly. The data stored on the gates of the switching transistors subsequently determine which binary weighted capacitors get charged and which remain uncharged when a charging voltage is applied across the capacitors.

In a preferred embodiment a precharge pulse having a polarity and amplitude to turn on the switching transistors is applied to the input node and is coupled via the N selectively enabled data transfer paths to all of the switching transistors. The precharge pulse functions to precharge the gate capacitance of the N switching transistors with a turn-on voltage in preparation for the subsequent application of the N digital data bits. The precharge pulse also functions to turn-on all the N switching transistors, in parallel, whereby the N binary weighted capacitors are connected in parallel and redistribute the charge previously stored on selected ones of the N capacitors thereby producing an analog voltage representative of the previously supplied N digital data bits.

Following the precharge of the gates of the N switching transistors, a data load period is initiated and the N selectively enabled data transfer paths are enabled to couple the respective data bits to the gate of its corresponding switching transistor so as to discharge the gate capacitance for one input signal condition or to maintain it charged for another input signal condition. This establishes a voltage corresponding to the value of each one of the N digital data bits on the gate of a corresponding switching transistor.

BRIEF DESCRIPTION OF THE DRAWINGS

In the accompanying drawings like reference characters denote like components.

DETAILED DESCRIPTION OF THE INVENTION

Figure 1:
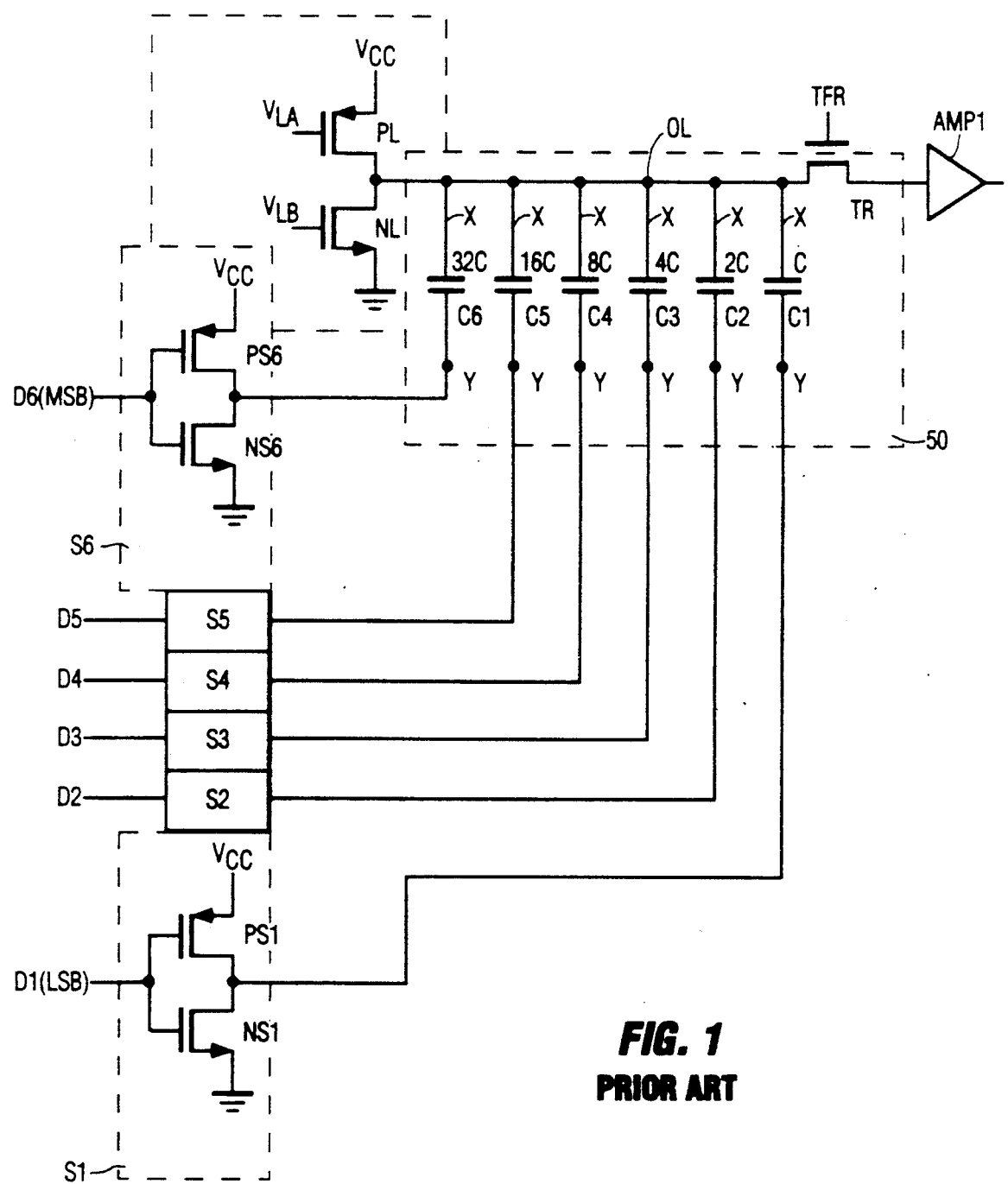
FIG. 1 is a schematic diagram of a prior art digital-to-analog (D/A) converter circuit.

Insulated-gate field-effect transistors (IGFET's) are the active devices preferred for use in practicing the invention. For this reason, the circuits are illustrated in the drawing as employing such transistors and will be so described hereinafter. However, this is not intended to preclude the use of other suitable devices and to this end, the term "transistor" when used without limitation in the appended claims is used in a generic sense.

In the figures, enhancement type IGFET's of n-conductivity type are identified by the letter N followed by a particular reference character. The characteristics of IGFET's are well known and need not be described in detail. But, for a clearer understanding of the description to follow, definition and characteristics of IGFET's pertinent to the invention are set forth below.

IGFET's have a first electrode and a second electrode referred to as the source and drain defining the ends of a conduction path, and a control electrode (gate) whose applied potential determines the conductivity of the conduction path. For an N-type IGFET, the source electrode is defined as that electrode of the first and second electrodes having the lowest potential applied thereto. The devices used are bidirectional in the sense that when an enabling signal is applied to the control electrode, current can flow in either direction in the conduction path defined by the first and second electrodes. For conduction to occur, the applied gate-to-source potential (Vgs) must be in a direction to forward bias the gate with respect to the source and must be greater in magnitude than a given value which is defined as the threshold voltage (Vt). When used as a source follower, the voltage at the source electrode (Vs) "follows" the signal applied at the gate (Vg) but is offset by the threshold voltage (Vt). Circuits and systems embodying the invention may be formed using transistors made of amorphous silicon which have low mobility, low gain and high threshold voltages (e.g., VT=5 volts). Lastly, IGFET's such as those made of amorphous silicon have some capacitance between their gate and source electrodes and between their gate and drain electrodes. The effect and use of this capacitance is discussed below.

Figure 2:
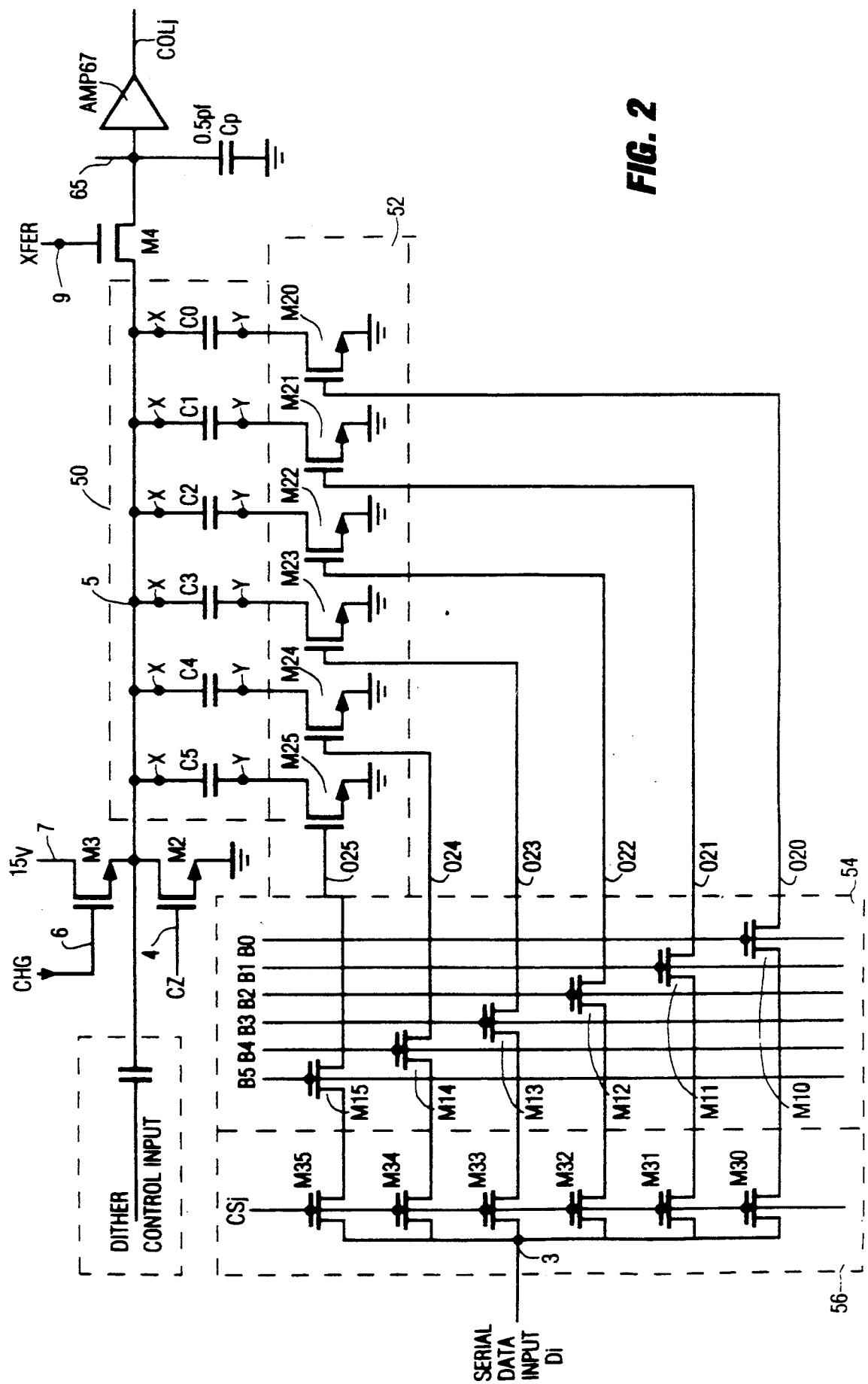
FIG. 2 is a schematic diagram of a digital-to-analog converter (DAC) circuit embodying the invention.
Figure 3:
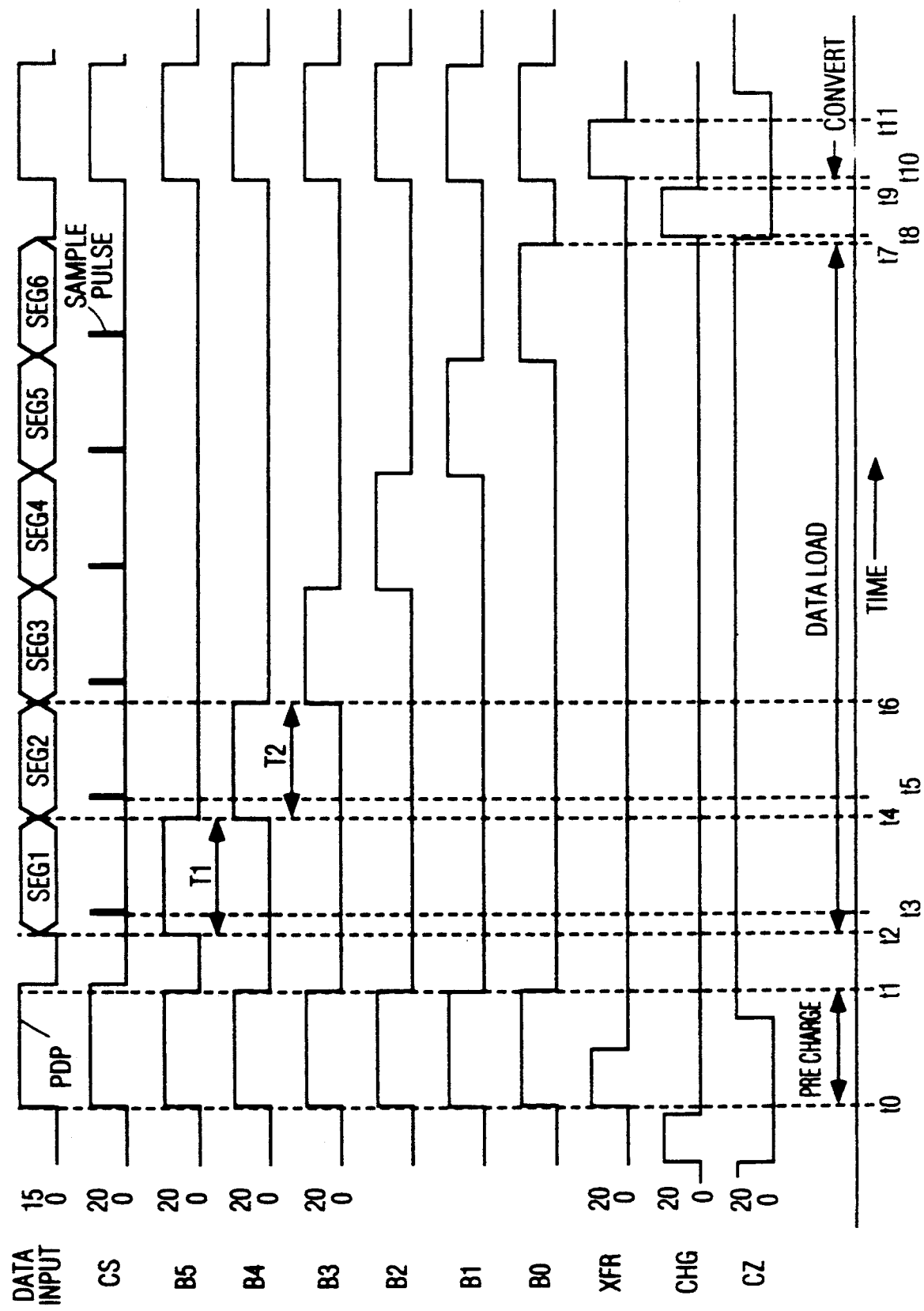
FIG. 3 is a diagram of waveforms useful for describing the operation of the circuit of FIG. 2.
Figure 6:
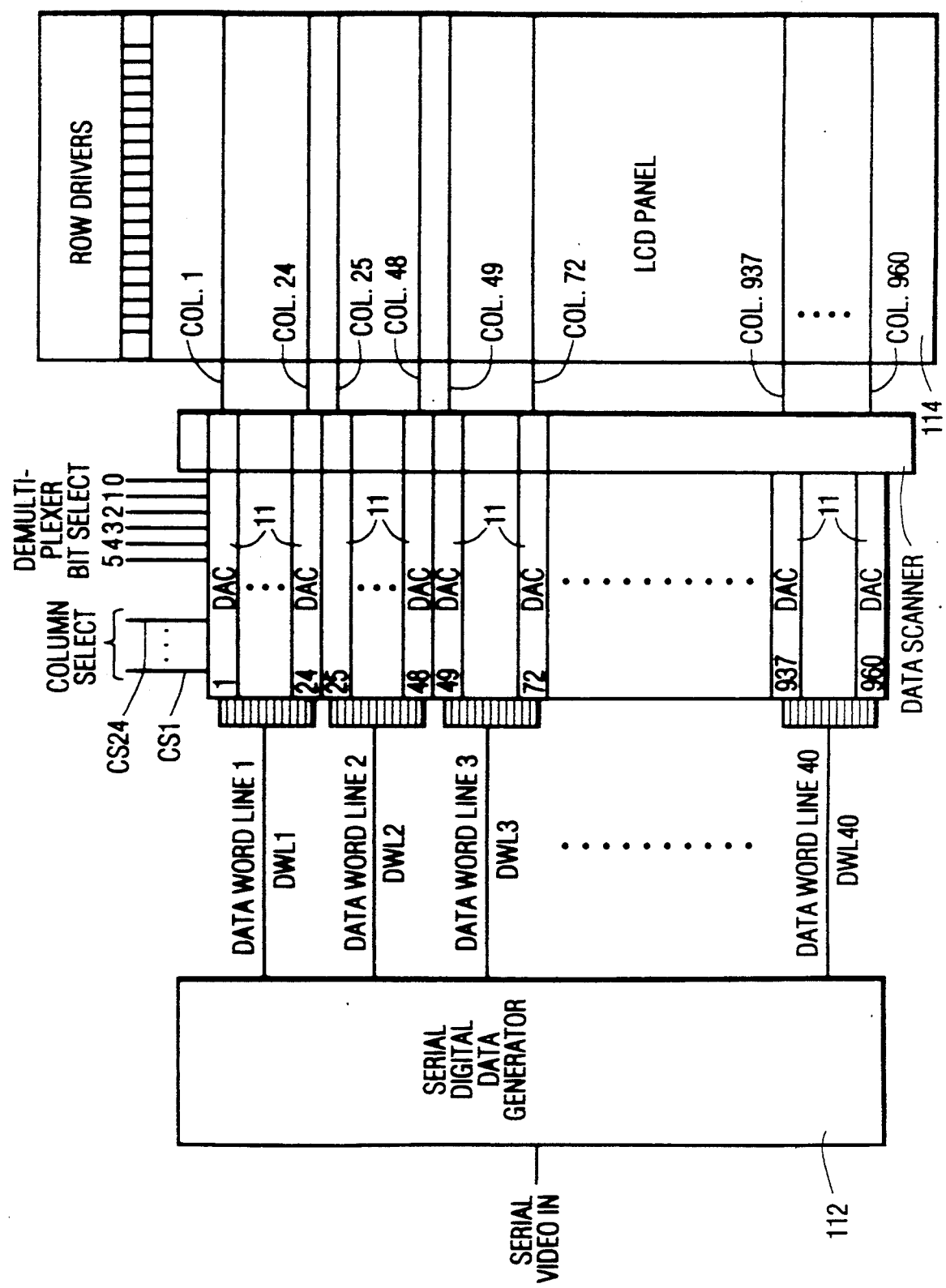
FIG. 6 is a block diagram of a system embodying the invention.
Figure 7:
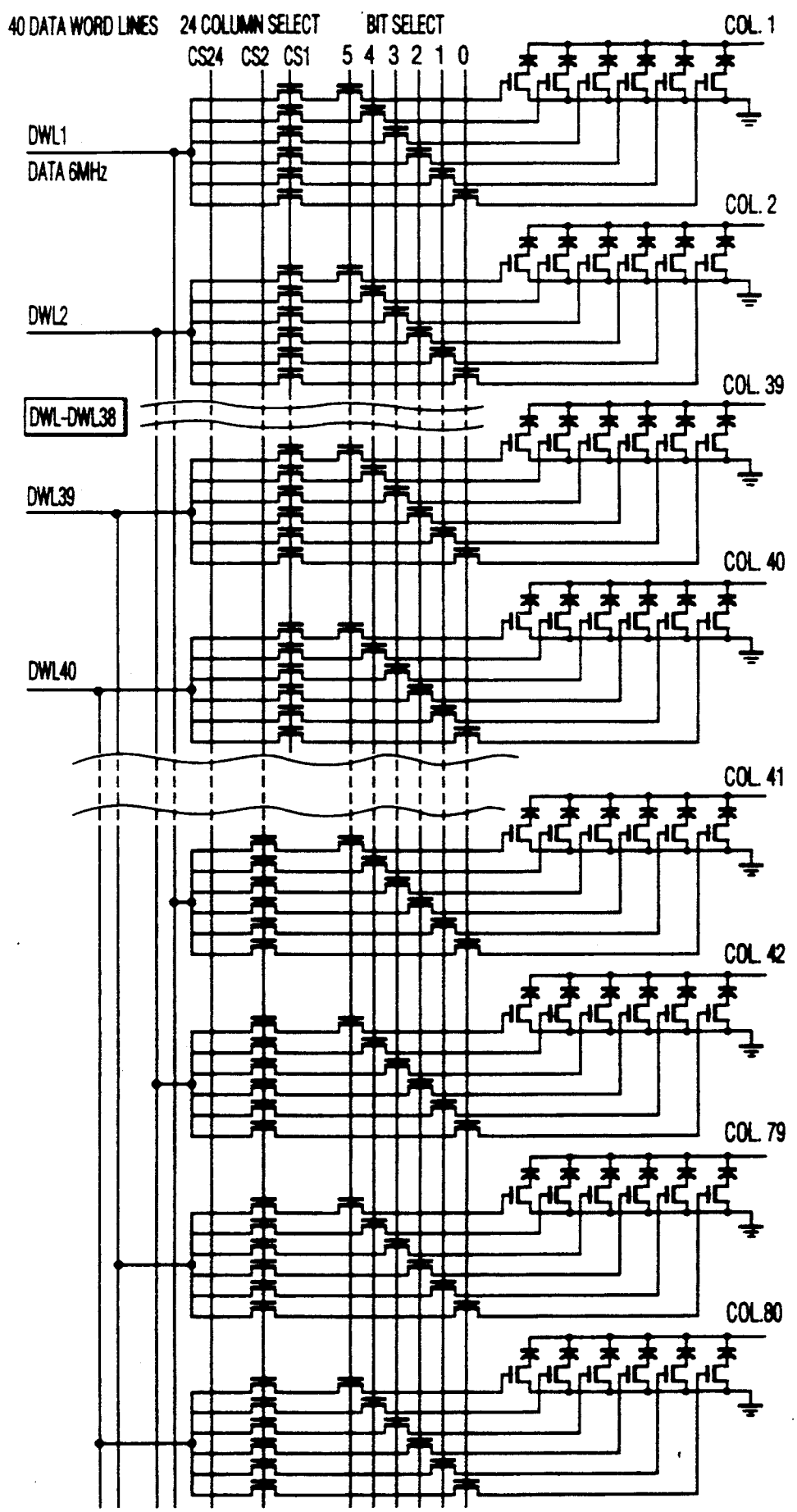
FIG. 7 is an idealized representation of part of the signal and control lines for use in the system of FIG. 6.

Referring to FIG. 2, there is shown a circuit 11 which functions to convert data bits (Di) serially applied to a data input terminal 3 to a corresponding analog voltage at output terminal 5. To better understand the structure and operation of the circuit of FIG. 2 note that the circuit of FIG. 2 may be incorporated in a DAC system of the type shown in FIGS. 6 and 7. Referring to FIG. 6, there is shown a serial digital data generator 112 with 40 output data word lines (DWL1 through DWL40), with generator 112 producing serial strings of digital signals in parallel on the 40 data word lines. During a data load cycle, each data word line carries 144 bits of serial information which are distributed onto 24 sublines with each subline carrying 6 data bits to its corresponding DAC 11. In FIG. 6 there are 40 word lines times 24 sublines per word line for a total of 960 sublines. Each subline being coupled to a DAC for converting 6 digital data bits into a corresponding analog voltage which, in the system of FIG. 6, is then used to drive a corresponding column conductor which is part of a liquid crystal display (LCD) panel 114.

Where the circuit of FIG. 2 is part of a DAC system of the type shown in FIGS. 6 AND 7, the data signals applied to terminal 3 may be as shown in waveform designated DATA INPUT in FIG. 3. The waveform DATA INPUT of FIG. 3 includes precharge periods followed by six data segments. During the precharge period a precharge data pulse (PDP) is applied to the input terminal 3. The PDP pulse is shown to have an amplitude of +15 volts and its pulse width may be assumed to be 4 microseconds. Following the precharge period there is a data load period during which data bits are serially applied to input terminal 3. For the system of FIGS. 6 and 7, the data load period is broken up into six segments with each segment containing 24 data bits. During the first segment (SEG 1) the 24 most significant bits (MSB) are applied to terminal 3 with each bit being distributed to a different one of 24 DAC circuits 11 of the type shown in FIG. 2. During the second segment (SEG 2) of the data load period the 24 next less significant bits are distributed to different ones of 24 DAC circuits. The process is repeated until the 24 least significant bits (LSB) are applied to terminal 3 and distributed to their respective DAC circuits. The data its are assumed to have either an amplitude of 15 volts representing a "high" or logic "1" or an amplitude at, or close, to zero volts representing a "low" or logic "0". The pulse width of each data bit is assumed to be 160 nanoseconds. Accordingly, for this example, a data load period includes the application of 144 pulses to terminal 3 over a period extending for at least 144×160 nanoseconds.

The 144 pulses applied to terminal 3 during a data load cycle are decoded via column select signals (CSj) and demultiplexing signals (Bi) to produce 24 different sets of 6 pulses. Each set of six pulses is converted via a DAC circuit 11 of the type shown in FIG. 2 to produce an analog voltage which is then used to drive a corresponding column conductor of a liquid crystal display (LCD) panel 114, as shown in FIG. 6.

The digital-to-analog (DAC) converter of FIG. 2 includes a binary weighted capacitor network 50, a capacitor switching transistor section 52 and a column select (CS) section 56 coupled between data input 3 and section 54. Binary weighted capacitor network 50 is comprised of six binary weighted storage capacitors, C0, C1, C2, C3, C4 and C5. Each higher numbered capacitor (Ci), going from the lowest numbered (C0) to the highest (C5), has twice the capacitance of the preceding, lower numbered, capacitor. By way of example, in this embodiment C0, C1, C2, C3, C4 and C5 have the values of 0.025 pf, 0.05 pf, 0.1 pf, 0.2 pf, 0.4 pf and 0.8 pf, respectively.

Each capacitor is connected at one terminal (plate, or side, X) to an output node 5. The conduction path of an N channel IGFET (m2i), which may be made of amorphous silicon, is connected between the other terminal (plate, or side, Y) of each capacitor and ground potential. The gate electrode of each one of the switching transistors M2i is connected to a corresponding terminal 02i of demultiplexer network 54.

Each transistor M2i, functions as an ON-OFF switch, and has its conduction path connected between the Y terminal of its associated capacitor Ci and ground potential. Specifically, the M2i transistors are identified in FIG. 2 as M20, M21, M22, M23, M24 and M25. When a capacitor switching transistor M2i is turned on it clamps the Y side of its associated capacitor Ci to ground. When a capacitor switching transistor M2i is turned off, the Y side of its associated capacitor is connected to an open switch and the Y side of that capacitor may be assumed to be floating.

As discussed below a significant aspect of the invention is the use of the gate capacitance of transistors M2i to store the precharge and data signals. The turn-on and turn-off of each one of switching transistors M2i is controlled by means of two series connected transistors M1i and M3i in bit demultiplexer network 54 and column select network 56. Specifically, the control (gate) electrode of each M2i transistor is connected via the series connected conduction path of a bit demultiplexing transistor M1i and a column select transistor M3i to serial data input terminal 3. Each bit demultiplexer transistor M1i is turned-on or off by means of a bit demultiplexer control pulse signal (bi) applied to its gate electrode. All the column select transistors M3i are turned on or off at the same time by means of a column select signal, CSj, applied to all their gate electrodes, in parallel.

A selectively enabled transistor M2 which functions to clamp terminal 5 to ground has its conduction path connected between output terminal 5 and ground with a control signal Cz applied to its gate at terminal 4.

A selectively enabled transistor M3 has its conduction path connected between a terminal 7 to which is applied an operating potential of 15 volts and the output line 5. A charge control signal CHG is applied to the gate electrode of M3 at terminal 6. Transistor M3 functions to selectively charge terminal 5 and selected storage capacitors (Ci) to the voltage (e.g., 15 volts) at terminal 7.

A selectively enabled transfer transistor M4 has its conduction path connected between terminal 5 and a terminal 65. A transfer (XFER) signal applied to the gate of M4 functions to transfer the analog signal at terminal 5 to a succeeding stage coupled to terminal 65. A capacitance CP which may be in the range of 0.5 pf is assumed to be present at output 65.

A typical cycle of the circuit of FIG. 2 will now be described with the aid of the waveform diagram of FIG. 3. A cycle will be examined going through a sequence which include: (1) a precharge (initialization) period; (2) a data load period during which data signals are transferred to the gate capacitance of the switching transistors; (3) a capacitor charge period; and (4) a charge redistribution and output signal period. It will be shown that, in circuits embodying the invention, this latter period also functions as and occurs during the precharge initialization period. Thus in circuits embodying the invention there need be only three periods (or phases).

The Precharge Period which lasts from a time t0 to a time t1 is initiated, as shown on FIG. 3, at a time t0 when:

(a) The column select (CSj) signal goes high (20 volts) as shown in the waveform designated CS in FIG. 3, whereby all the M3i transistors are turned-on;

(b) The demultiplexer signals (Bi) are also pulled high (at 20 volts) as shown for waveforms B0–B5 in FIG. 3, whereby all the demultiplexing transistors M1i are turned-on; and (c) A precharge data pulse (PDP) applied to node 3 is high (at 15 volts) as shown in waveform DATA INPUT of FIG. 3, applying a voltage of +15 V volts to node 3.

Since a voltage of +20 volts is applied to the gate electrodes of all the M1i and M3i transistors, they are turned-on hard (overdriven) and couple the PDP voltage of +15 V volts via their conduction paths to the gate electrodes of all the switching transistors M2i. The gate capacitance (Cgi) of each one of the M2i transistors which may be assumed to be in the order of 0.1 pf is then charged to +15 V volts.

Figure 4A:
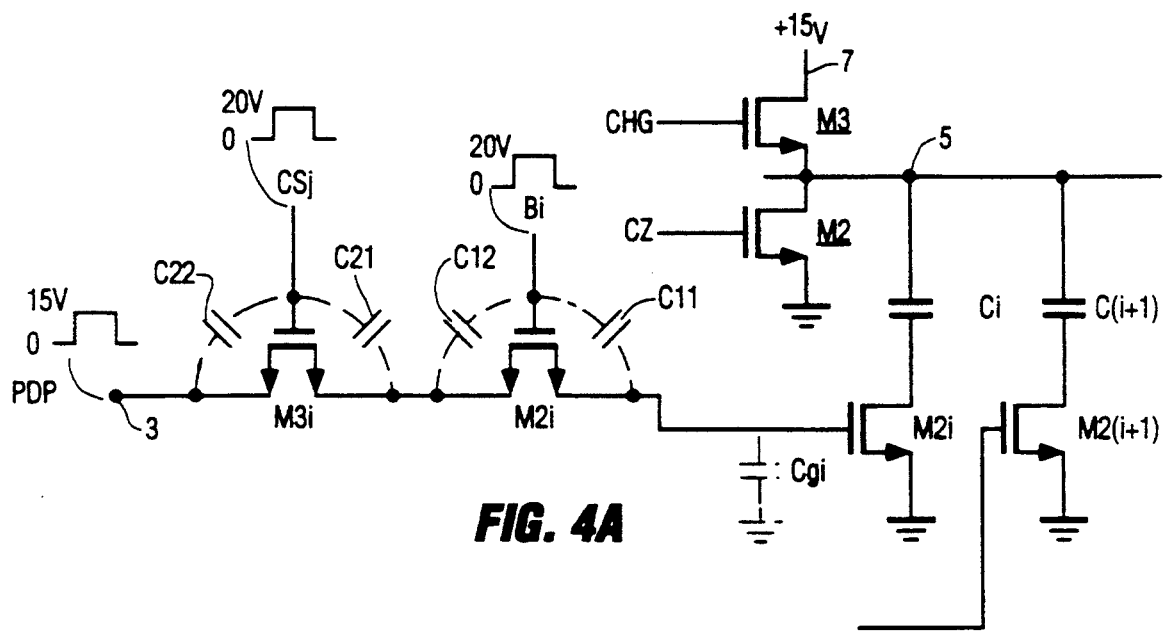
FIG. 4A is a schematic diagram of a portion of the circuit of FIG. 2 detailing various capacitances associated with the transistors of the circuit of FIG. 2.

The precharge period terminates at a time t1 when the Bi signals go low (i.e., from 20 volts to zero volts). Shortly thereafter the column select signal (CS) goes low after which the precharge data pulse (PDP) goes low. The sequence in which the Bi signals, the CS signal, and the precharge data pulse (PDP) go low ensures that the gate capacitance of all the M2i transistors remain charged to a high voltage. This is best explained with reference to FIG. 4A which shows the gate-to-drain and gate-to-source capacitances of transistors M3i and M1i. That is, transistor M1i has a capacitance C11 between its gate and source and a capacitance C12 between its gate and drain and transistor M3i has a capacitance C21 between its gate and source and a capacitance C22 between its gate and drain.

Figure 4B:
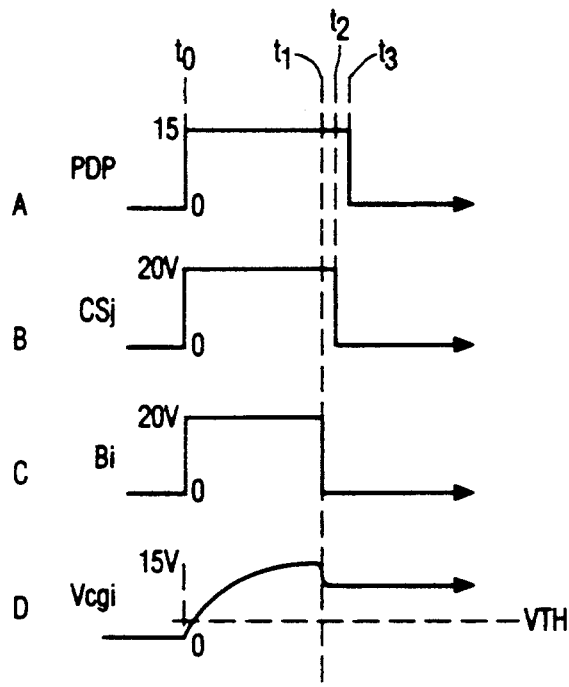
FIG. 4B is a waveform diagram useful for describing the FIG. 4A circuit.

As discussed above, during precharge, the precharge data pulse (PDP) applied to input node 3 is equal to +15 volts ("high") and remains "high" from time t0 to t3, as shown in the waveforms of FIG. 4B. The bit control signal (Bi) applied to the gate of demultiplexer transistor M1i has an amplitude of 20 volts which lasts from time t0 to t1 as shown in waveforms Bi of FIG. 4B. The column select (CSj) signal applied to the gate of column select transistor M3i has an amplitude of 20 volts and lasts from time t0 to t2 as shown in waveforms CSj of FIG. 4B. The Bi and CSj signals of +20 volts amplitude overdrive transistors M1i and M3i, respectively, whereby even though M3i and M1i conduct in the source follower mode the full amplitude (+15 volts) of the data input signal is coupled to the gate of switching transistor M2i and charges their gate capacitances, Cgi, to a value of 15 volts. Note that the precharge pulse is also of sufficiently long duration to ensure that the gate capacitance of the switching transistors are fully charged to +15 volts as shown in waveform (Vcgi) of FIG. 4B.

As already noted above the M1i transistors are turned-off before the M3i transistors to preserve the high precharge voltage on the gate capacitance of the switching transistors. The transistors (i.e., M1i) which are closest to the switching transistors (M2i) are turned off first. This occurs when Bi goes from +20 volts to zero at time t1. Then, transistor M3i is turned-off with CSj going from +20 volts to zero volts at time t2. The PDP then goes from +15 volts to ground at time t3. By turning-off M1i before M3i the precharge level applied to M2i is least affected by the negative termination steps of Bi and CSj as explained below. When the Bi signal terminates at time t1 and goes from 20 volts to zero volts, a sharp negative transient step is coupled via C11 to the gate of M2i tending to decrease the +15 volts precharge signal previously applied to, and being stored on, the gate of M2i. When CSj swings from 20 volts to 0 volts at time t2 a like negative step is coupled via C21 from the gate of M2i to its source. If CSj were to go low followed by Bi going low, the gate of M2i would be subjected to two large negative going steps. By turning off M1i first, only the negative step due to the termination of Bi has a significant effect on the gate voltage of M2i. Also note that the precharge data pulse goes low after Bi has gone low and M1i has been turned-off to ensure that the gate of M2i remains precharged to a high level. As noted above, the Vt of transistors made of amorphous silicon may be in the range of 5 volts. Therefore, the system is designed such that the gates of the switching transistors, when intended to be turned-on, will be charged to voltages which range from 8 to 15 volts to ensure that they are turned-on hard and capable of clamping the y side of the binary weighted capacitors to ground.

During a data load period, which follows the precharge period, six digital input signals (D0–D5), representing the value of an input signal whose digital value is to be converted to a corresponding analog signal, are serially applied as shown in waveform DATA INPUT of FIG. 3 to input terminal 3 and transferred on to the gate capacitance of corresponding M2i transistors, as described below.

Referring again to FIGS. 2 and 3, during the Data Load Period:

(a) The CZ signal is high, turning on transistor M2 and clamping node 5 to ground potential;

(b) the charging signal (CHG) applied to the gate of transistor M3 is low, as shown in waveform CHG of FIG. 3, whereby transistor M3 is turned-off; and (c) the transfer signal (XFER) applied to the gate of transistor M4 is low whereby M4 is turned-off.

In the circuit of FIG. 2, data load is accomplished by sampling the digital data signals serially applied to input node 3 and applying a corresponding signal onto the gate capacitance of a corresponding selected M2i transistor, as detailed below.

The digital data bits are applied to node 3 in an order (or sequence) with the most significant bit (MSB) being applied first and the least significant bit (LSB) last. The most significant bit (MSB), also identified as D5, is coupled via transistors M35 and M15 to the gate of M25. The next less significant bit [(M−1)SB], also identified as D4, is coupled via transistors M34 and M14 to the gate of M24. The process is repeated until the least significant bit (LSB), also identified as D0 is coupled via transistor M30 and M10 to the gate of M20.

At time t2 as shown in FIG. 3 the demultiplexing signal B5 goes high (+20 volts) and remains high for an interval T1 until time t4. During the interval T1, transistor M15 is enabled, and during this interval 24 MSB digital data signals are applied to node 3. One of these 24 MSB's is selected for a respective DACj by conditioning the associated CSj signal to exhibit a MSB selection or sample pulse during the interval t1–t4. In this example the column selection pulse (CSj) occurs at time t3 and remains high for approximately one MSB bit interval. When CS is high, transistor M25 is turned-on whereby M15 and M35 provide a conduction path or data transfer path between input node 3 and the gate of M25.

Recall that the gate capacitance of M25 was precharged to a "high" level which may be in the range of +8 to +15 volts. Note also that transistors M35 and M15 are overdriven with 20 volts applied to their gate electrodes.

If the MSB data signal (D5) is "high", then M35 and M15 tend to conduct in the source follower mode to reestablish the full 15 volts on the gate of M25. The response of M35 and M15 in the source follower mode is slow and they function as a relatively high impedance path to the data signal, even though they are overdriven. However, since the gate capacitance of M25 is already precharged to a "high" value, M35 and M15 are not needed to charge the gate of M25. Hence, M25, whose gate is precharged to a voltage which is substantially greater than the minimum threshold voltage of M25, remains turned-on hard clamping the Y side of capacitance C5 to ground potential. If the MSB data signal (D5) is "low", transistors M35 and M15 conduct in the common source mode and their series connected conduction paths provide a relatively low impedance path capable of quickly discharging the gate capacitance of M25 to ground. Thus, in the circuit of FIG. 2, when transistors M35 and M15 are turned-on and the MSB data signal is low, they conduct in the common source mode enabling the relatively quick discharge of the gate capacitance of the M25 transistor to ground and the turn-off of transistor M25. In the system of FIG. 6 following the transfer of all the MSB data signals (D5) to the gates of all the respective M25 transistors, transistor M15 is turned-off at a time t4 just prior to signal B4 going high.

In a like manner, after all the MSB's have been loaded onto the gates of the M25 transistors, the next bits of lower significance are loaded onto the gates of the M24 transistors during a time interval T2 (i.e., t4–t6) as shown for waveform B4 of FIG. 3. Similarly to the previous description, B4 goes "high" at time t4, turning on transistor M14, and CS goes "high" at time t5 turning on transistor M34. During the interval that transistor M34 conducts the (M−1)SB is coupled to the gate of M24.

It has therefore been shown that during the data load period a serial data bit (Di) is applied to data input node 3. The digital data bit (Di) is, for example, valid for 160 nanoseconds. The CSj signal turns-on transistor M3i, for example, for a period of time (e.g., 150 nanoseconds) during which the digital data Di is valid. Thus the CSj signal is used to sample the digital data input signal serially applied to node 3 while the demultiplexer transistor M1i is turned-on. If Di is high the gate capacitance (Cgi) of M2i remains charged to a high level. If Di is "low" Cgi is discharged via M1i and M3i to ground.

It should be appreciated that the gate capacitance, Cgi, of the switching transistors M2i is relatively small (e.g., 0.05 pf to 0.1 pf) whereby the gate capacitance Cgi can be charged very quickly.

It should also be appreciated that in circuits embodying the invention, a serial data input signal Di is captured (or sampled) and stored on the gate capacitance Cgi of a switching transistor M2i. The combination of M1i and M3i and the gate capacitance of M2i function as a sample and hold circuit which can respond very quickly and satisfy the timing requirements of the system, even though the transistors used to practice the invention may be made of amorphous silicon, having low mobility, low gain, and high threshold voltages.

The process of sampling the digital data input signal (Di) is repeated until the 6 data bits of the serial data are applied to the gate electrodes of the 6 capacitor control switching transistors M25–M20.

In circuits embodying the invention the gates of the M2i transistors are precharged to the condition (high) which would take the longest time to establish. Consequently the data transfer from node 3 can be done relatively quickly since it only requires discharge of the gate capacitance when the input signal is "low" and the M1i and M3i can operate in the common source node to discharge the gate capacitance node quickly.

The MSB data bits are all loaded prior to the lesser significant bits to allow the MSB switching transistors maximum time to discharge the larger capacitors (C5's). Then the next lesser significant data bits are all loaded to allow the corresponding switching transistors the next longest time interval to discharge the associated transistors, etc. This mode of operation has been determined to be preferable to sequentially loading all to data bits of respective DAC's.

After the data bits have been loaded (applied) to the gates of the capacitor control switching transistors M2i, transistor M2 is turned-off and transistor M3 is turned-on. This is achieved by the signal CHG going high and the signal CZ going low at time t8 as shown in corresponding waveforms in FIG. 3. The source of transistor M3 is connected to node 5, its drain is connected to node 7 to which +15 volts is applied and its gate is connected to node 6 to which a control charging voltage (CHG) of 20 volts is applied. When M3 is turned-on, a potential of +15 volts is coupled to node 5.

When M3 turns on and +15 volts is applied to node 5, only those capacitors, Ci, whose corresponding switching transistors M2i are turned-on, will be charged. That is, for example, assuming the gate of M24 to be storing a "high" potential, the conduction path of M24 provides a low impedance conduction path for capacitor C4 and clamps the (Y) side of capacitor C4 to ground. Capacitor C4 will have a voltage of +15 volts coupled to its top plate (X) (connected to node 5) and zero volts coupled to its bottom plate (Y). Conversely if the gate of M24 is discharged, then M24 is an open switch and there will be no conduction path to charge capacitor C4.

At the termination of the capacitor charging period, the capacitors Ci corresponding to which the serial digital data bits, Di, are "high," will be charged having +V (e.g., 15) volts across their plates while the capacitors Ci corresponding to which the serial data bits, Di, are "low," will not be charged. The capacitor charge period is terminated when CHG returns to zero (t9), and M3 is turned-off.

Following the charge phase, all the column select signals (CS) go high and all the demultiplexer signals (Bi) go high concurrently. All the transistors M3i are then turned-on and all the transistors M1i are also turned-on and the voltage at node 3 goes "high" applying a PDP of +15 volts to the gates of the M2i transistors charging all their gates to the high level and turning-on all the M2i transistors.

The turn-on of all the M2i transistors causes all the Ci capacitors to be connected in parallel, which in turn causes a redistribution of the charge stored on the selectively charged capacitors Ci, to all the capacitors C0 to C5. Consequently, after the charge is redistributed, a voltage is produced across the storage capacitors Ci whose amplitude corresponds to the binary (digital) value of the previously applied digital data serial input word; i.e., the data signals applied during the preceding data load.

Charge redistribution is known and need not be discussed in great detail. The following brief example should suffice to explain the operation. Assume, for example, that during the data load, only the gates of M24 and M23 are charged to a high condition and the gates of M25, M22, M21 and M20 are discharged. Then, during the capacitor charging (conversion) period, only capacitors C4 and C3 are charged. The charge Q4 stored across C4 may be expressed as $Q4=(C4)(V)$ and the charge Q3 stored across C3 may be expressed as $C3=(C3)(V)$. Since C4 and C3 are connected in parallel, the total stored charge ($Q_T$) is equal to $(C3+C4)V$.

When all the capacitors are subsequently connected in parallel, the charge stored on C3 and C4 is redistributed among all the capacitors and the voltage (Vf) across the capacitors may be expressed as $Vf=(C3+C4)(V)/C_T$. For this particular example and assuming the capacitors to be binary weighted $C3=8$ Co, $C4=16$ Co, $CT=63$ Co and, $Vf=(24/63)V$.

The voltage produced at node 5 may be transferred to a succeeding stage by the application of a positive going transfer (XFR) pulse to the gate of transistor M4 (i.e., when XFR pulse goes high at time t10. The turn-on of M4 functions to couple the capacitance of a succeeding stage (CP) in parallel with the storage capacitors Ci. In practice, the analog voltage at node 5 when transferred to the next stage will be attenuated due to the presence of CP.

Note, as indicated in FIG. 2, a dither signal may be imposed on the output node 5 if desired to improve the effective resolution of the DAC. The dither signal may be a pulsed signal, with pulses occurring concurrently with the XFR pulses, and having an amplitude corresponding to one half the output potential representing an LSB, for example.

A significant aspect of the invention is that the precharge of the gates of the capacitor control transistors M2i also functions to provide the charge redistribution and the generation of the analog voltage at node 5 which is coupled via M4 to an amplifier 67.

Figure 5:
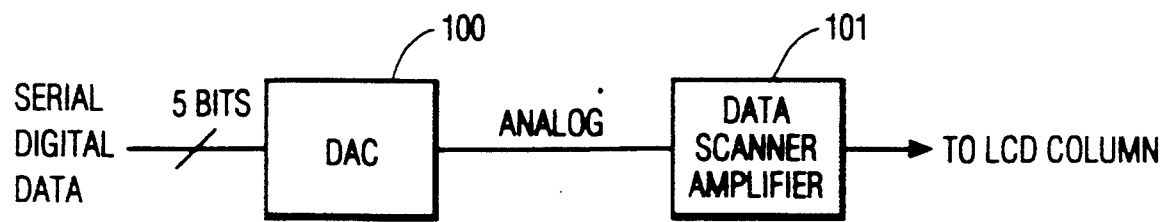
FIG. 5 is a block diagram of a DAC embodying the invention coupled to a data scanner for driving a column conductor of a liquid crystal display (LCD) panel.

The circuit FIG. 2 may be used to implement the digital-to-analog conversion (DAC) function in the system outlined in FIG. 5. Serial digital data signals are applied to a digital-to-analog converter (DAC) 100 of the form shown in FIG. 2 to produce an analog signal which is applied to a data scanner 101 whose output is applied to the column(s) of a liquid crystal display (LCD) panel.

A block diagram of a DAC system incorporating circuits embodying the invention is shown in FIG. 6 and was discussed above. A serial video input signal is applied to serial digital data generator 112 which functions to format the incoming information and to produce serial data on 40 output channels or data word lines, DWL1 through DWL40. Each data word line is coupled via 24 sublines to 24 different DAC circuits of the type shown in FIG. 2. Six data bits of the 144 bits serially produced on each subline are sampled in time via column select and demultiplexer bit select lines and applied to each DAC circuit 11 to produce an analog voltage which is used to drive a corresponding column conductor of LCD panel 114. In FIG. 6 each column select line (CS) controls the propagating signals corresponding to every 24th column. In FIG. 7 each column select line (CS) controls the propagating signals corresponding to a set of 40 consecutive columns. The distribution of data bits from the data word line to some of the DAC circuits is detailed in FIG. 7. In brief, although they differ in source details, the systems of FIGS. 6 and 7 are similar in that serial bits are propagated in parallel on 40 lines. The serial bits on each data word line are then propagated onto 24 sublines, each subline corresponding to one column conductor of an LCD panel and each subline carrying 6 serial data bits to be converted to an analog voltage for driving its corresponding column conduction.

Figure 8:
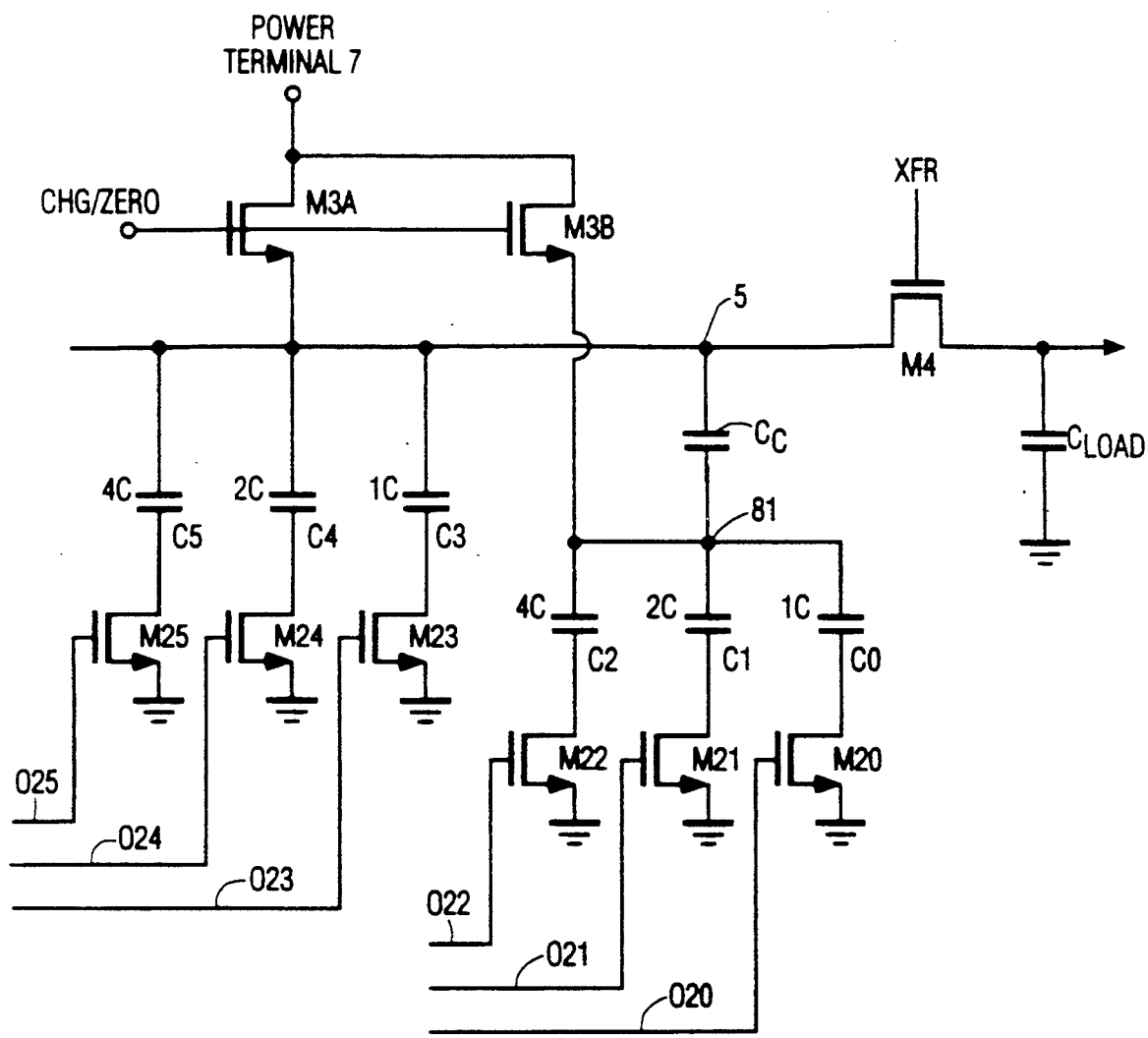
FIG. 8 is a partial schematic diagram of a subranging capacitive network suitable for use in circuits embodying the invention.

The binary weighted capacitive network 50 shown in FIG. 2 requires that each succeeding capacitor be twice the size of a preceding capacitor. This calls for the manufacture of a wide range of capacitors, and that either very large capacitors or very small capacitors are made. (Note that where more than 6 binary steps are desirable the problem becomes worse.) Very small capacitors are difficult to make accurately and there is an additional problem with stray capacitance. Large capacitors take too much space. These problems may be alleviated by the subranging type circuit shown in FIG. 8. Binary weighted capacitors C3, C4 and C5 may be made to have a capacitance of, for example, 0.05 pf, 0.1 pf and 0.2 pf, respectively. The top plates of capacitors C0, C1 and C2 are connected in common to a node 81 and a coupling capacitor Cc is connected between node 81 and output node 5 to which one side of C3, C4 and C5 are connected. Capacitor Cc functions to divide down the values of capacitors C0, C1 and C2 and to produce a network equivalent to that of 50 in FIG. 2.

Using 2 equal ratio sections, with each section having N levels (steps or stages), the coupling capacitor Cc may be calculated as follows:

$Cc = \frac{1}{2}C_3(2^N/2^N - 1)$.

for $N=3$, $Cc = \frac{1}{2}C_3(8/7)$.

Thus a capacitor network can be formed with two sets of capacitors and a coupling capacitor. The capacitors in one set can be (but need not be) the same as the capacitors in the other set and, for example, only three different capacitors are required for each set in addition to the coupling capacitor. Transistors M3A and M3B coupled to nodes 5 and 81, respectively perform the same function as transistor M3 in FIG. 2.

Figure 9B:
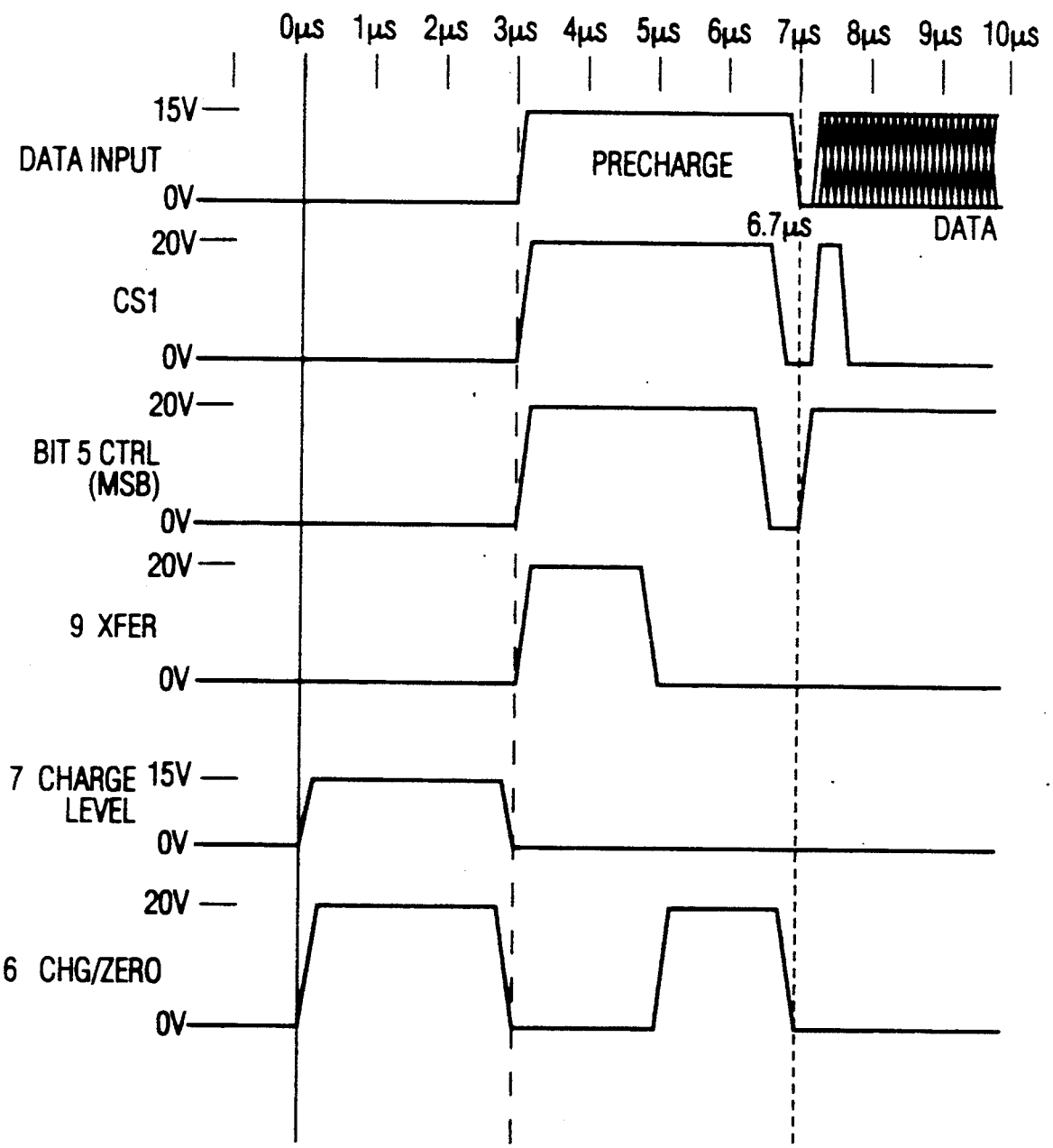
FIGS. 9A and 9B show a simplified circuit arrangement and waveforms for use in circuits embodying the invention.
Figure 9A:
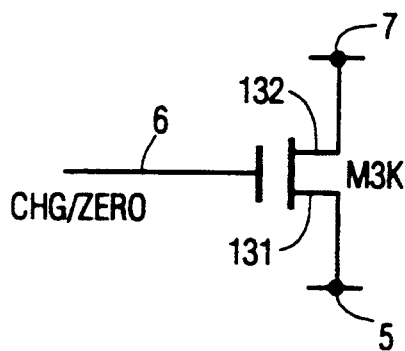

In the circuit of FIG. 2 transistor M3 is used to selectively apply a charging voltage to node 5 and transistor M2 is used to selectively clamp node 5 to ground. Alternatively, a single transistor M3k could be used to perform the functions of transistors M3 and M2 if connected and operated as shown in FIGS. 9A and 9B. Referring to FIG. 9A, note that transistor M3k would be connected in the circuit of FIG. 2 instead of transistors M3 and M2 with one electrode (source/drain) 131 connected to output node 5 and another electrode (drain/source) 132 connected to power terminal 7. The gate of transistor M3k would be driven with the CHG/ZERO signal of the type shown in waveform 6 of FIG. 9B and a potential (charge level) of the type shown in waveform 7 of FIG. 9B would be applied to power terminal 7. The precharge, data input, column select and bit select signals would be similar to those shown and used in the circuit of FIG. 2, discussed above.

The circuit of FIG. 2 is shown to be a six bit Digital to Analog converter. However it should be appreciated that this is only by way of example and more, or less data bits, and a corresponding number of capacitors and transistors would be also used to practice the invention.

A particular switching sequence has been illustrated in the drawings. However it should be evident that other switching sequences and different positioning of the M3i and M1i transistors may be employed without departing from the teachings of the inventors.

Also, the circuit and systems has been shown to have 40 word lines each supplying 24 sublines for producing 960 analog voltages driving 960 columns of a display panel. It should be evident that the total number of outputs could be more or less and the ratio or word lines to sublines may have many different values.

What is claimed is:

1. A digital-to-analog converter (DAC) comprising:
   a source of potential;
   an output node;
   means for charging said output node to predetermined potentials during predetermined intervals, and conditioning said output node to exhibit a high impedance during further predetermined intervals;
   N capacitors, each capacitor having first and second plates, with the first plate of each capacitor coupled to said output node;
   N switching transistors, each switching transistor having a control electrode, with a capacitance associated therewith, and each switching transistor having a conduction path for selectively connecting the second plates of respective ones of said capacitors to said source of potential;
   means for precharging the control electrodes of said N switching transistors during a precharge interval;
   an input port for applying digital data input signals during a data load interval;
   N selectively enabled data transfer paths connected between said input port and respective control electrodes of said N switching transistors; and
   means coupled to said N data transfer paths for selectively enabling said transfer paths to couple said digital data input signals to the control electrodes of respective said N switching transistors during said data load interval.

2. The DAC as claimed in claim 1 wherein said N capacitors are ordinally numbered with each higher ordinally numbered capacitors having twice the capacitance value of the preceding numbered capacitor.

3. The DAC as claimed in claim 2 wherein the capacitance associated with control electrode of each switching transistor is relatively small in comparison to the capacitance of the largest ones of the N capacitors.

4. The DAC as claimed in claim 1 wherein each one of said N selectively enabled data transfer paths includes a transistor, each transistor having a conduction path and a control electrode, and wherein the conduction paths of the transistor of each data transfer path has its conduction paths connected in series between said input port and the control electrode of its associated switching transistor.

5. The DAC as claimed in claim 4 wherein said means for precharging the control electrodes of said N switching transistors, applies a potential to the control electrodes of said switching transistors of sufficient amplitude to condition the respective switching transistor into conduction, and wherein each one of the applied digital data input signals has a first binary value whose amplitude is approximately equal to the amplitude of said precharge signal and a second binary value which when coupled to the control electrode of a switching transistor is of an amplitude to condition the switching transistor to cease conduction.

6. The DAC as claimed in claim 4 wherein said transistor in each data transfer path conducts in the source follower mode when applying said first binary values to the control electrodes of respective switching transistors and conducts in the common source mode when applying said second binary values to the control electrodes of respective switching transistors.

7. The DAC as claimed in claim 1 wherein said switching transistors and each of said transistors in each data transfer path are made of amorphous silicon.

8. The DAC set forth in claim 1 wherein said input port is a single conductor for application of a composite serial signal including precharge pulses which are followed with serial data bits, and wherein said N selectively enabled data transfer paths respectively include first and second transistors having respective conduction paths coupled in cascade between said input port and the control electrode of a respective switching transistor, and having respective control electrodes, the respective control electrodes of the first transistors being connected together for reception of a demultiplexing control signal, and the control electrodes of the respective second transistors being respectively arranged for reception of bit selection signals.

9. The DAC as claimed in claim 8 wherein said first and second transistors of each data transfer path are concurrently conditioned to conduct during predetermined intervals and the one of the first and second transistors of each data transfer path whose conduction path is connected at the control electrode of the respective switching transistor is conditioned to cease conduction before the other one of the first and second transistors is conditioned to cease conduction.

10. The DAC set forth in claim 1 wherein K (K an integer) of said N capacitors are direct connected to said output node, and N-K of said N capacitors are connected to said output node by means comprising:
    an intermediate node;
    means direct connecting the first plates of said N-K capacitors to said intermediate node;
    a further capacitor coupled between said intermediate node and said output node.

11. The DAC set forth in claim 10 further including means for charging said intermediate node to predetermined potentials during predetermined intervals, and conditioning said intermediate node to exhibit a high impedance during further predetermined intervals;

12. A digital-to-analog converter (DAC) comprising:
    an input terminal and an output terminal;
    a first power terminal for the application thereto of a first fixed reference potential;
    N weighted storage capacitors; each capacitor having first and second plates, with the first plate of each one of said N capacitors being connected in common to said output terminal; where N is an integer greater than one;
    N switching transistors, one switching transistor per capacitor, each switching transistor having source and drain electrodes defining the ends of a conduction path and a gate electrode with which there is associated gate capacitance;

means connecting the conduction path of each switching transistor between the second plate of its corresponding capacitor and said first power terminal;

means coupled between said input terminal and the gate electrodes of said switching transistors for: (a) selectively sampling N digital data signals at said input terminal and coupling each sampled signal to the gate electrode of a different one of each one of said N switching transistors whereby their gate electrodes are charged to a first turn-on level or are discharged to a second turn-off level; and (b) selectively precharging the gate capacitance of each one of said N switching transistors to a first turn-on level; including means for selectively applying a potential to the gate electrode of all of said N control transistors for turning them all on whereby said N storage capacitors are connected in parallel and charge selectively stored on said storage capacitors is redistributed among all of the storage capacitors for producing an output voltage which represents said digital data signals; and means for applying a charging potential to said output terminal for charging said output terminal to a second operating potential, whereby those capacitors whose associated switching transistors are charged to said first turn-on level are charged to a value of potential equal to the difference between said second operating potential and said first fixed reference potential.

13. The DAC of claim 12, wherein said means coupled between said input terminal and the gate electrodes of said N switching transistors, includes:

N demultiplexer transistors and N column select transistors; one demultiplexer transistor and one column select transistor per switching transistor; and wherein the conduction paths of one demultiplexer transistor and the conduction path of one column select transistor are connected in series between a data input point and the gate electrode of its associated switching transistor.

14. The DAC of claim 13, wherein the demultiplexers transistors have their conduction paths connected between the conduction paths of the column select transistors and the gate electrodes of the switching transistors.

15. The DAC of claim 14, wherein said means of applying a potential to said output terminal for charging the gate electrodes of the switching transistors includes a charging transistor having a conduction path connected between said output terminal and a second power terminal to which is applied a second fixed potential.

16. A digital-to-analog converter (DAC) for converting a set of N data bits to an analog voltage comprising:

N capacitors and N switching transistors, one capacitor and an associated switching transistor for each one of said N data bits;

each capacitor having first and second plates;

means connecting the first plate of each capacitor to an output node;

each one of said N switching transistors having first and second electrodes defining the ends of a conduction path and a control electrode, each control electrode having associated therewith a relatively small capacitance;

means connecting the conduction path of each switching transistor between the second plate of its associated capacitor and a first power terminal;

an input node adapted to receive serially supplied digital data signals during a data load interval and a precharge signal during a precharge interval;

N selectively enabled data transfer paths, one data transfer path per each one of said N switching transistors, each data transfer path connected between said input node and the control electrode of its associated switching transistor;

means for selectively turning-on said N data transfer paths, one at time, during said data load interval for selectively sampling the digital data signals and for applying and storing a voltage corresponding to each one of said digital data signals on the gate of a corresponding one of said N switching transistors; and means for selectively applying a voltage across said capacitors for charging them in accordance with the data responsive voltage levels present on the gate of their respective switching transistors.

17. A digital-to-analog converter (DAC) for converting N-bit digital values to respective analog voltages comprising:

an output node with an output capacitor coupled thereto;

an intermediate node;

a plurality of capacitors;

a plurality of switches, one switch associated with each of said plurality of capacitors and forming respective series connections of a capacitor and a switch between said intermediate node and a source of reference potential;

means for applying said N-bit digital values for controlling said plurality of switches;

means for charging said intermediate node to at least one predetermined potential during at least one portion of respective sample conversion intervals; and a further switch, for coupling said intermediate node to said output node during a second portion of respective sample conversion intervals.

18. The digital-to-analog converter set forth in claim 17 wherein said means for applying said N-bit digital values for controlling said plurality of switches comprises:

a plurality of selectively enabled data transfer paths arranged to couple bits of said N-bit digital values to respective control electrodes of said switches;

means for selectively turning-on said plurality of transfer paths during at least a data load portion of said respective sample conversion intervals.

19. The digital-to-analog converter set forth in claim 18 wherein each of said plurality of selectively enabled data transfer paths includes a respective field effect transistor, and wherein each of said plurality of switches includes a switching transistor having a control electrode, and said digital-to-analog converter further comprises:

means for precharging the control electrodes of said switching transistors to a potential sufficient to condition all of said switching transistors into one of the states of conduction and non-conduction, which potential is of such value that the respective said field effect transistors in the respective data transfer paths operate in a common source mode when applying said N-bit digital values to respective control electrodes of said switching transistors.

20. The digital-to-analog converter set forth in claim 18 wherein said N-bit digital values occur in bit-serial format and each of said plurality of selectively enabled data transfer paths includes:

an input node for receiving said N-bit digital values;

a demultiplexer transistor and a column select transistor for each of said switching transistors; and means for coupling the conduction paths of one demultiplexer transistor and the conduction path of one column select transistor in series between said input node and the control electrode of a switching transistor.

* * * * *